United States Patent
Wu

(10) Patent No.: US 9,690,144 B2
(45) Date of Patent: Jun. 27, 2017

(54) CURVED LIQUID CRYSTAL PANEL WHEREIN STAGE DIFFERENCES BETWEEN PRIMARY AND SECONDARY PHOTO-SPACERS DECREASE FROM A CENTER TO BOUNDARIES THEREOF AND MANUFACTURING METHOD OF THE SAME

(71) Applicant: SHENZHEN CHINA STAR OPTOELECTRONICS TECHNOLOGY CO., LTD., Shenzhen, Guangdong (CN)

(72) Inventor: Chuan Wu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 259 days.

(21) Appl. No.: 14/418,324

(22) PCT Filed: Dec. 12, 2014

(86) PCT No.: PCT/CN2014/093673
§ 371 (c)(1),
(2) Date: Jan. 29, 2015

(87) PCT Pub. No.: WO2016/061883
PCT Pub. Date: Apr. 28, 2016

(65) Prior Publication Data
US 2016/0109743 A1    Apr. 21, 2016

(30) Foreign Application Priority Data
Oct. 21, 2014 (CN) .......................... 2014 1 0562737

(51) Int. Cl.
*G02F 1/1339* (2006.01)
*H01L 27/12* (2006.01)

(52) U.S. Cl.
CPC ...... *G02F 1/13394* (2013.01); *H01L 27/1262* (2013.01); *G02F 2001/13396* (2013.01)

(58) Field of Classification Search
CPC ....... G02F 1/13394; G02F 2001/13396; H01L 27/1262
See application file for complete search history.

(56) References Cited

U.S. PATENT DOCUMENTS 5,307,190 A * 4/1994 Wakita .............. G02F 1/133305
349/153
5,766,694 A    6/1998 West et al.
(Continued)

FOREIGN PATENT DOCUMENTS

CN    103713426 A    4/2014
JP    2008076782 A    4/2008
TW    201133430 A    10/2011

*Primary Examiner* — Paul Lee
(74) *Attorney, Agent, or Firm* — Muncy, Geissler, Olds & Lowe, P.C.

(57) ABSTRACT

A liquid crystal panel and manufacturing method thereof are provided. The liquid crystal panel includes: an array substrate provided with thin film transistors; a color filter substrate provided with primary photo-spacers and secondary photo-spacers. The primary photo-spacers correspond to the thin film transistors. Stage differences between the secondary photo-spacers and the primary photo-spacers decrease from the center of the panel to the boundaries thereof. Liquid crystal is filled within space between two substrates, which are then sealed. By applying a design that utilizes stage differences between the primary and secondary photo-spacers being different, optical performance decrease caused by non-uniform box thickness in different regions is prevented.

14 Claims, 4 Drawing Sheets

(56) References Cited

U.S. PATENT DOCUMENTS

| | | | |
|---|---|---|---|
| 2009/0284904 A1* | 11/2009 | Wu | G02F 1/133305 |
| | | | 361/679.01 |
| 2011/0228190 A1 | 9/2011 | Yang et al. | |
| 2012/0020056 A1* | 1/2012 | Yamagata | G02F 1/133308 |
| | | | 362/97.1 |
| 2014/0092350 A1 | 4/2014 | Byeon et al. | |

* cited by examiner

CURVED LIQUID CRYSTAL PANEL WHEREIN STAGE DIFFERENCES BETWEEN PRIMARY AND SECONDARY PHOTO-SPACERS DECREASE FROM A CENTER TO BOUNDARIES THEREOF AND MANUFACTURING METHOD OF THE SAME

FIELD OF THE INVENTION

The present invention relates to a field of liquid crystal display, and particularly to a curved liquid crystal panel and manufacturing method thereof.

BACKGROUND OF THE INVENTION

During the manufacture of a display panel (i.e. a liquid crystal display or a TFT-LCD), a layer of photo-spacers (PS) is usually formed between an array substrate 10 and a color filter (CF) substrate 20 for supporting a cell gap between the array substrate 10 and the color filter substrate 20. In the process, it should be ensured that height of the cell gap is equal everywhere.

As shown in FIG. 1A, the photo-spacers are classified into primary photo-spacers 21 and secondary photo-spacers 22. The primary photo-spacer 21 is connected with a thin film transistor (TFT) 11, and an end of the secondary photo-spacer is hung in the air. In this case, there is a height difference between the primary photo-spacer 21 and the secondary photo-spacer 22, i.e. a photo-spacer stage difference 30. In a usual case, only the primary photo-spacer 21 is working. As shown in FIG. 1B, the secondary photo-spacer 22 works only when the panel is squeezed.

In manufacturing a curved television, the theory of which is shown as FIG. 1B, since the curved television has a certain radian to be inward concave or outward convex, a sliding force is generated between the array substrate 10 and the color filter substrate 20. The leftward and rightward sliding forces are respectively generated on the left and right sides of the panel with respect to the center of the panel served as a base point, and a force produced by squeezing the top substrate 10 and the bottom substrate 20 is greater than the forces on the left and right sides. Since the stage differences 30 between the primary photo-spacers and the secondary photo-spacers are designed in an equal manner, i.e. the height difference between the primary photo-spacer 21 and the secondary photo-spacer 22 is equal everywhere, the center portion will be seriously squeezed by stress. Therefore, the cell gap of the center of the curved panel is smaller than both of the sides thereof, so that, the penetration rate and the response time of the center are different from the sides, thereby decreasing the optical performance of the curved liquid crystal panel.

Accordingly, designing a photo spacer suitable for a curved display panel to ensure a uniform thickness and stable quality has become a major direction for research and development of liquid crystal display equipments.

SUMMARY OF THE INVENTION

Accordingly, the present invention provides a curved liquid crystal panel and manufacturing method thereof, and intends to keep thickness being equal throughout the curved liquid crystal panel by a design that utilizes different heights of photo-spacers in different regions, so as to be effective in decreasing mura defects caused by the non-uniform thickness of a box of the panel.

In order to solve the above-mentioned problem, the technical solution of the present invention is as follows:

A curved liquid crystal panel is provided, comprising an array substrate provided with a plurality of thin film transistors; a color filter substrate provided with a plurality of primary photo-spacers and a plurality of secondary photo-spacers, where the primary photo-spacers correspond to a location of the thin film transistors; stage differences between the secondary photo-spacers and the primary photo-spacers decrease from a center of the curved liquid crystal panel to boundaries thereof; and liquid crystal being filled within a display area located between the array substrate and the color filter substrate, which are sealed by using a sealant.

Preferably, lengths of the secondary photo-spacers decrease from the center of the curved liquid crystal panel to the boundaries thereof and are dependent upon a predetermined radian of the curved liquid crystal panel.

Preferably, lengths of the primary photo-spacers are the same.

Preferably, cross-sections of the primary photo-spacer and the secondary photo-spacer are trapezoidal-shaped, and the primary photo-spacers and the secondary photo-spacers are arranged in pairs.

Preferably, the primary photo-spacers are disposed opposite the thin film transistors by contacting the thin film transistor without being fixed thereto.

Preferably, the primary photo-spacer and the secondary photo-spacer are spherical-shaped. The stage difference is meant for a diameter difference between the primary photo-spacer and the secondary photo-spacer.

In order to solve the above-mentioned problem, the technical solution of the present invention is as follows.

A method for manufacturing a curved liquid crystal panel is provided, comprising:

preparing an array substrate which is provided with a plurality of thin film transistors;

preparing a color filter substrate which is provided with a plurality of primary photo-spacers and a plurality of secondary photo-spacers, where stage differences between the secondary photo-spacers and the primary photo-spacers decrease from a center of the curved liquid crystal panel to boundaries thereof;

filling liquid crystal;

adhering the array substrate and the color filter substrate, where the primary photo-spacers correspond to a location of the thin film transistors; and forming the curved liquid crystal panel by bending a liquid crystal box to a predetermined radian.

Preferably, lengths of the secondary photo-spacers decrease from the center of the curved liquid crystal panel to the boundaries thereof and are dependent upon a predetermined radian of the curved liquid crystal panel.

Preferably, the primary photo-spacers and the secondary photo-spacers are arranged in pairs, and lengths of the primary photo-spacers are the same.

Preferably, in the step of adhering the array substrate and the color filter substrate, the liquid crystal is filled within a cell gap located between the array substrate and the color filter substrate.

In comparison with the prior art, the present invention provides a design that utilizes the stage differences between the primary photo-spacers and the secondary photo-spacers being gradually changed, so that the thickness of the curved liquid crystal panel is kept consistent, and it is effective in decreasing light spots caused by the non-uniform thickness of a box of the panel, thereby increasing the image quality of the liquid crystal display device.

BRIEF DESCRIPTION OF THE DRAWINGS

In order to illustrate the technical solutions in the embodiments of the present invention or in the prior art more clearly, the following briefly introduces the accompanying drawings required for describing the embodiments or the prior art. It should be apparent that the accompanying drawings in the following description are merely some embodiments of the present invention, and persons of ordinary skill in the art may still derive other drawings from these accompanying drawings without creative effort.

DETAILED DESCRIPTION OF THE INVENTION

Figure 1A:
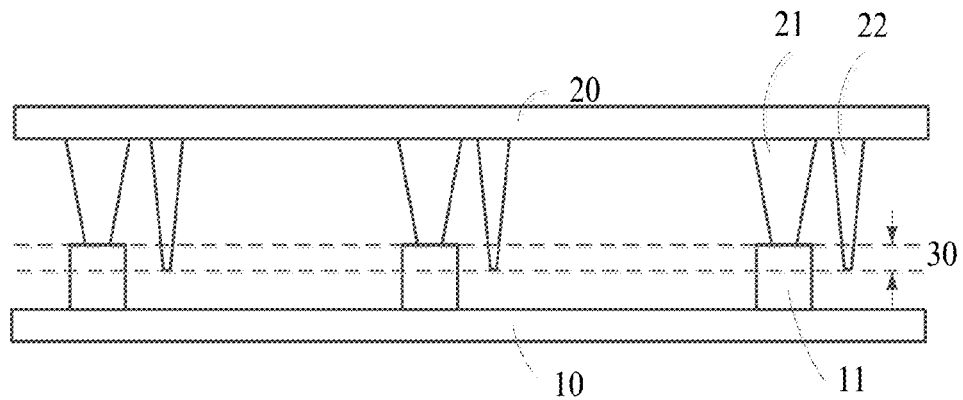
FIG. 1A is a cross sectional schematic diagram of a flat display device in a normal situation in the prior art.
Figure 1B:
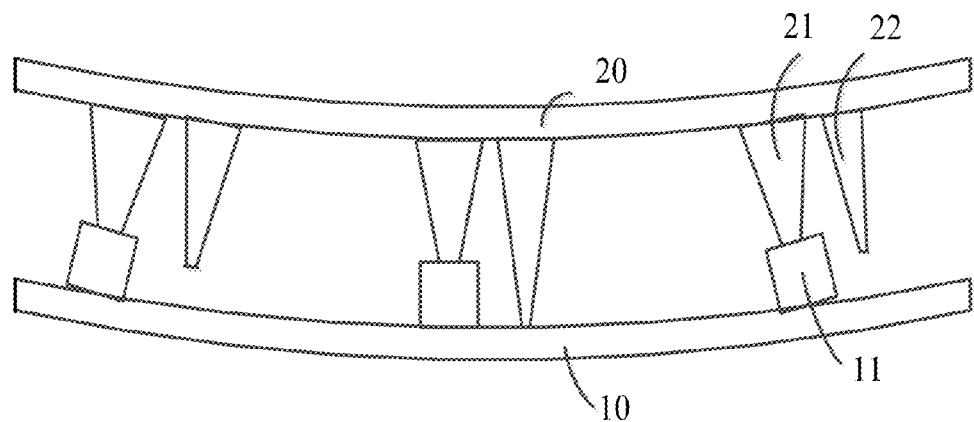
FIG. 1B is a cross sectional schematic diagram of the flat display device in a squeezed situation in the prior art.

Please refer to the accompanying drawings, similar parts are denoted with the same reference numerals. The following description is based on the particular embodiments of the present invention, and they should not be construed as limiting the invention to the other embodiments which are not discussed in detail herein.

First Embodiment

Figure 2:
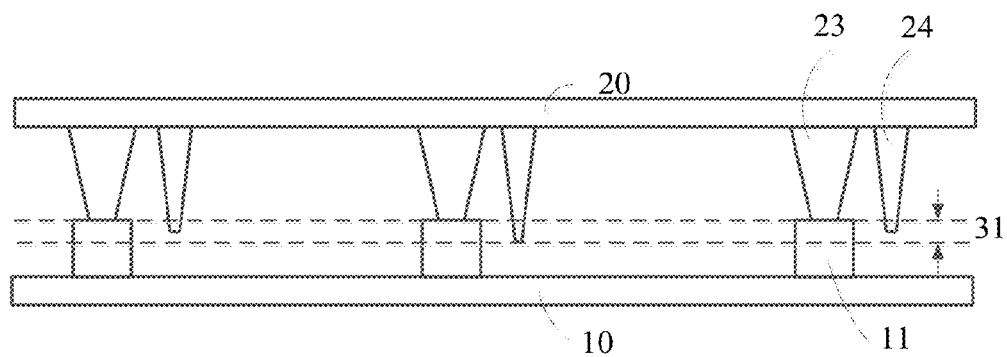
FIG. 2 is a cross sectional schematic diagram of a curved liquid crystal panel before squeezing of an embodiment of the present invention.

Please refer to FIG. 2, which shows a cross sectional schematic diagram of a curved liquid crystal panel before squeezing of an embodiment of the present invention.

A curved liquid crystal panel is formed by assembling an array substrate 10 and a color filter substrate 20, where the array substrate 10 is provided with a plurality of thin film transistors 11. The color filter substrate 20 is provided with a plurality of primary photo-spacers 23 and a plurality of secondary photo-spacers 24. Liquid crystal (not shown) is filled within a display area located between the array substrate 10 and the color filter substrate 20, which are sealed by using a sealant (not shown).

To be specific, the primary photo-spacer 23 corresponds to the thin film transistor 11. It should be understood that "corresponds" usually means that they are contacted but unfixed with each other. That is, the primary photo-spacer 23 and the thin film transistor 11 can support each other. However, while being having an external force, such as squeezing, there may be a relative displacement.

The secondary photo-spacers 24 and the primary photo-spacers 23 are arranged in pairs, and the stage difference between the primary photo-spacer 23 and the adjacent secondary photo-spacer 24 increases from the center of the liquid crystal panel to the boundaries thereof.

It can be understood that the way of generating the stage difference comprises:

First: the lengths of the secondary photo-spacers 24 decrease from the center of the curved liquid crystal panel to the boundaries thereof, but the lengths of the primary photo-spacer 23 are the same.

Second: the lengths of the secondary photo-spacers 24 and the primary photo-spacer 23 decrease from the center of the curved liquid crystal panel to the boundaries thereof, but the degree of variation of the secondary photo-spacer 24 is greater than the primary photo-spacer 23.

The above-mentioned variation of the stage difference depends upon a predetermined radian of the curved liquid crystal panel and the specific corresponding position of each primary photo-spacer 23 and secondary photo-spacer 24 in the curved liquid crystal panel.

The shape of the primary photo-spacer 23 and the secondary photo-spacer 24 comprises columnar-shaped and spherical-shaped, where the spherical-shaped will be taken as an illustrative example hereinafter. For example, in one kind of design, cross-sections of the primary photo-spacer 23 and the secondary photo-spacer 24 are trapezoidal-shaped. That is, the shapes of the primary photo-spacer 23 and the secondary photo-spacer 24 are tapered or trapezoidal. In the other design, it is not excluded that the primary photo-spacer 23 and the secondary photo-spacer 24 is spherical. It can be understood that the height difference means a diameter difference, and its variation rule is the same as the conception of the stage difference in this design.

Second Embodiment

Please refer to FIG. 2, which shows a cross sectional schematic diagram of a curved liquid crystal panel before squeezing of an embodiment of the present invention.

A curved liquid crystal panel is formed by assembling an array substrate 10 and a color filter substrate 20, where the array substrate 10 is provided with a plurality of thin film transistors 11. The color filter substrate 20 is provided with a plurality of primary photo-spacers 23 and a plurality of secondary photo-spacers 24. Liquid crystal is filled within a display area located between the array substrate 10 and the color filter substrate 20, which are sealed by using a sealant.

To be specific, the primary photo-spacer 23 corresponds to the thin film transistor 11. It should be understood that "corresponds" usually means that they are contacted but unfixed with each other. That is, the primary photo-spacer 23 and the thin film transistor 11 can support each other. However, while being applied with an external force, such as squeezing, there may be a relative displacement.

The secondary photo-spacers 24 and the primary photo-spacers 23 are arranged in pairs, and the length of the secondary photo-spacer 24 is varied depending upon its location in curved liquid crystal panel. For example, it decreases from the center of the liquid crystal panel to the boundaries thereof and are dependent upon a predetermined radian of the curved liquid crystal panel.

In addition, the length of the secondary photo-spacer 24 can be same as the corresponding primary photo-spacer 23, and can also be changed with the secondary photo-spacer 23, but the degree of variation is smaller. That is, the lengths of the primary photo-spacer 23 and the secondary photo-spacer 24 will drive their stage difference to decrease from the center of liquid crystal panel to the boundaries thereof.

The above-mentioned the variation depends upon a predetermined radian of the curved liquid crystal panel and the specific corresponding position of each primary photo-spacer 23 and secondary photo-spacer 24 in the curved liquid crystal panel.

The shape of the primary photo-spacer 23 and the secondary photo-spacer 24 comprises columnar-shaped and spherical-shaped, where the spherical-shaped will be taken as an illustrative example hereinafter. For example, in one kind of design, cross-sections of the primary photo-spacer 23 and the secondary photo-spacer 24 are trapezoidal-shaped. That is, the shapes of the primary photo-spacer 23 and the secondary photo-spacer 24 are tapered or trapezoidal.

In the other design, it is not excluded that the primary photo-spacer 23 and the secondary photo-spacer 24 is spherical. It can be understood that the height difference means a diameter difference, and its variation rule is the same as the conception of the stage difference in this design.

Third Embodiment

Figure 3:
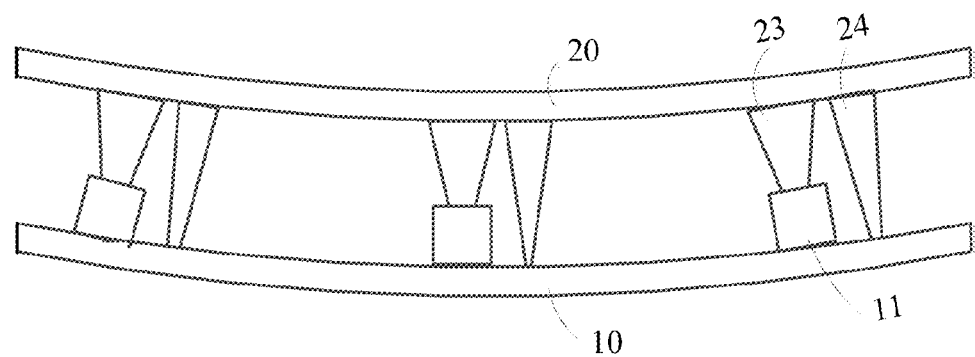
FIG. 3 is a cross sectional schematic diagram of FIG. 2, where the curved liquid crystal panel is squeezed inward.
Figure 4:
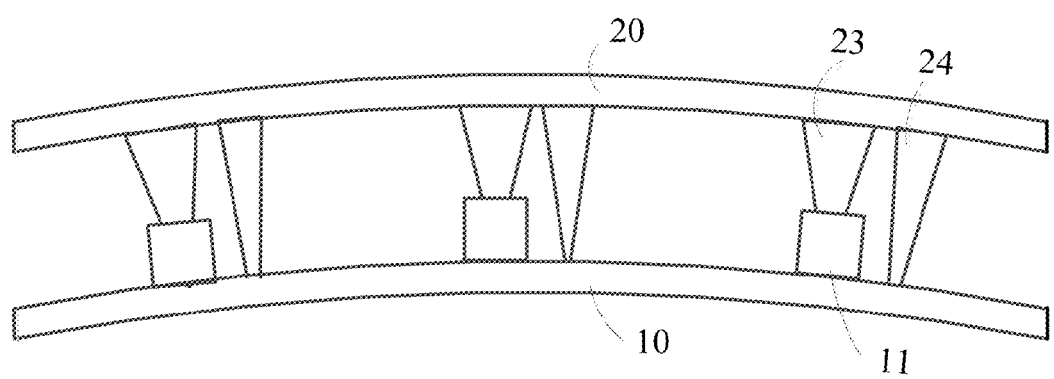
FIG. 4 is a cross sectional schematic diagram of FIG. 2, where the curved liquid crystal panel is squeezed outward.

Please refer to a concave-type surface shown in FIG. 3 and a convex-type surface shown in FIG. 4, which are formed by squeezing the liquid crystal panel shown in FIG. 2.

As shown in FIG. 3, the array substrate 10 and the color filter substrate 20 are bent inwardly from a side of the array substrate 10, so that the primary photo-spacer 23 corresponds to the thin film transistor 11, and the secondary photo-spacer 24 corresponds to a board surface of the array substrate 10.

As shown in FIG. 4, the array substrate 10 and the color filter substrate 20 are bent inwardly from a side of the color filter substrate 20, so that the primary photo-spacer 23 corresponds to the thin film transistor 11, and the secondary photo-spacer 24 corresponds to a board surface of the array substrate 10.

That is, the box thickness of the curved liquid crystal display panel is kept equal, thereby preventing the optical quality from decreasing due to non-uniform thickness.

Fourth Embodiment

Figure 5:
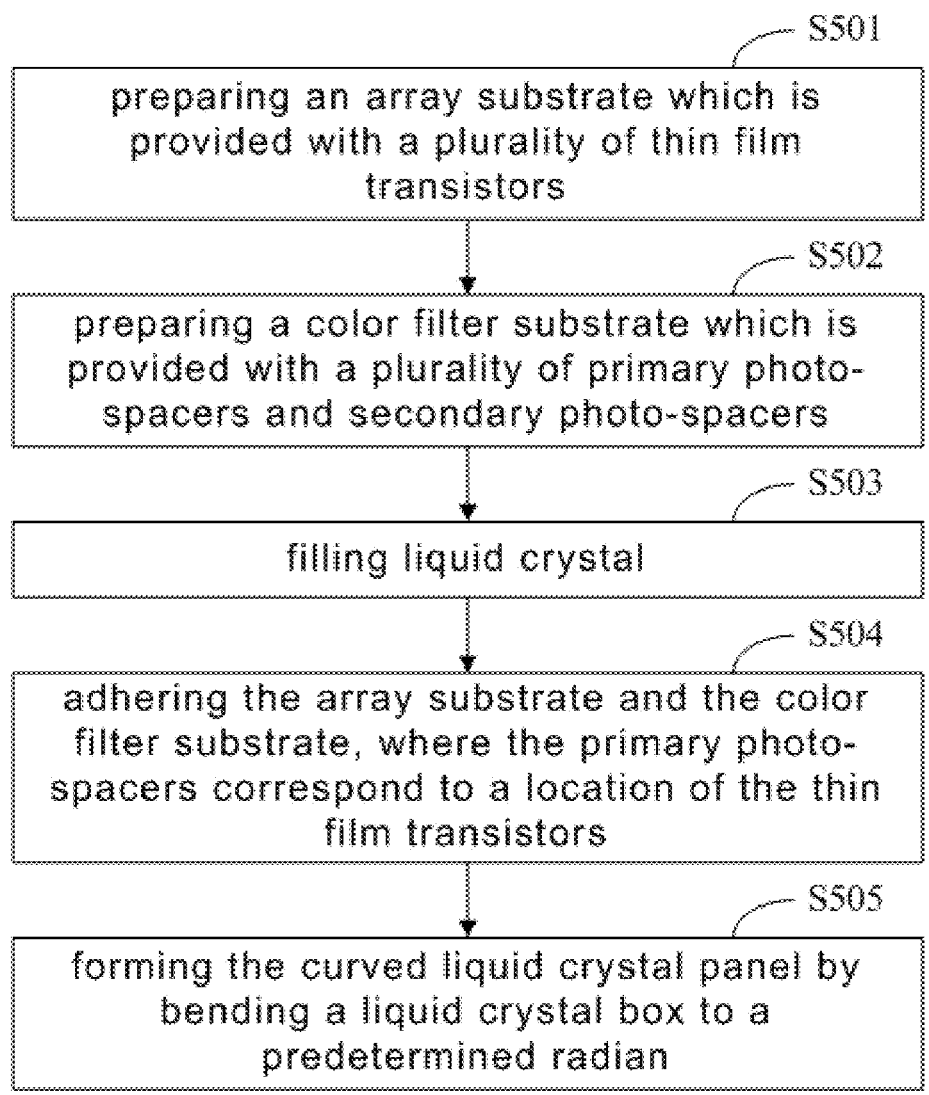
FIG. 5 is a flow chart schematic diagram of manufacturing a curved liquid crystal panel of an embodiment of the present invention.

Please refer to FIG. 5, which is a flow chart schematic diagram of manufacturing a curved liquid crystal panel of an embodiment of the present invention. The method for manufacturing the curved liquid crystal panel comprises:

In a step S501, an array substrate is prepared, and the array substrate is provided with a plurality of thin film transistors.

In a step S502, a color filter substrate is prepared, and the color filter substrate provided with a plurality of primary photo-spacers and secondary photo-spacers. Stage differences between the secondary photo-spacers and the primary photo-spacers decrease from a center of the curved liquid crystal panel to boundaries thereof.

It can be understood that the plurality of primary photo-spacers and secondary photo-spacers are arranged in pairs. Lengths of the secondary photo-spacers decrease from the center of the liquid crystal panel to the boundaries thereof and are dependent upon a predetermined radian of the curved liquid crystal panel. The lengths of the primary photo-spacers are the same or the degree of variation of is smaller than the secondary photo-spacers.

In addition, the primary photo-spacer and the secondary photo-spacer may be columnar or spherical. It can be understood that the stage difference means the height difference between the primary photo-spacer and the secondary photo-spacer. When the primary photo-spacer and the secondary photo-spacer are spherical, it is the diameter difference.

In a step S503, Liquid crystal is filled.

In a step S504, the array substrate is adhered with the color filter substrate. The primary photo-spacers correspond to a location of the thin film transistors.

It can be understood that "corresponds" means unfixedly contacting. That is, the primary photo-spacer 23 and the thin film transistor 11 can support each other. However, while being applied with an external force, such as squeezing, there may be a relative displacement.

In addition, it should be noted that in the process of adhering the liquid crystal is filled within a cell gap between the array substrate and the color filter substrate.

In a step S505, the curved liquid crystal panel is formed by bending a liquid crystal box to a predetermined radian.

In should be understood that the bending manner comprises the concave-type surface shown in FIG. 3 and the convex-type surface shown in FIG. 4.

Based on a characteristic of a curved display device (force generated by squeezing a top and bottom substrates at the center of the curved display device is greater than at the left and right sides thereof), the present invention applies a design that utilizes stage differences between the primary photo-spacers and secondary photo-spacers being different. When the curved display device is of the concave-type, the stage difference at the center is greater than at both of the sides. Therefore, since there is a great stage difference at the center region, it exhibits good pressure endurance during forming the curved display device. Since there is a small stage difference at the borders region, it exhibits poor pressure endurance. Also, the force applied on the center is great, so that the box thickness of the whole region (i.e. cell gap) of the display device is kept consistent (the specific stage difference dependent upon a predetermined radian of the display device). Similarly, the box thickness of a convex-type curved display device can be kept consistent via the same manner. In summary, the above descriptions are merely preferable embodiments of the present invention, but are not intended to limit the scope of the present invention. Any modification or replacement made by those skilled in the art without departing from the spirit and principle of the present invention should fall within the protection scope of the present invention. Therefore, the protection scope of the present invention is secondaryject to the appended claims.

What is claimed is:

1. A curved liquid crystal panel, comprising:
    an array substrate provided with a plurality of thin film transistors;
    a color filter substrate provided with a plurality of primary photo-spacers and a plurality of secondary photo-spacers, wherein the primary photo-spacers are disposed opposite the thin film transistors by contacting the thin film transistor without being fixed thereto, and stage differences between the secondary photo-spacers and the primary photo-spacers decrease from a center of the curved liquid crystal panel to boundaries thereof, lengths of the secondary photo-spacers decrease from the center of the curved liquid crystal panel to the boundaries thereof and are dependent upon a predetermined radian of the curved liquid crystal panel; and
    liquid crystal being filled within a display area located between the array substrate and the color filter substrate, which are sealed by using a sealant.

2. The curved liquid crystal panel according to claim 1, wherein lengths of the primary photo-spacers are the same.

3. The curved liquid crystal panel according to claim 2, wherein cross-sections of the primary photo-spacer and the secondary photo-spacer are trapezoidal-shaped, and the primary photo-spacers and the secondary photo-spacers are arranged in pairs.

4. The curved liquid crystal panel according to claim 1, wherein the primary photo-spacer and the secondary photo-spacer are spherical-shaped.

5. A curved liquid crystal panel, comprising:
an array substrate provided with a plurality of thin film transistors;
a color filter substrate provided with a plurality of primary photo-spacers and a plurality of secondary photo-spacers, wherein the primary photo-spacers are disposed opposite the thin film transistors; stage differences between the secondary photo-spacers and the primary photo-spacers decrease from a center of the curved liquid crystal panel to boundaries thereof; and
liquid crystal being filled within a display area located between the array substrate and the color filter substrate, which are sealed by using a sealant.

6. The curved liquid crystal panel according to claim 5, wherein lengths of the secondary photo-spacers decrease from the center of the curved liquid crystal panel to the boundaries thereof and are dependent upon a predetermined radian of the curved liquid crystal panel.

7. The curved liquid crystal panel according to claim 6, wherein lengths of the primary photo-spacers are the same.

8. The curved liquid crystal panel according to claim 7, wherein cross-sections of the primary photo-spacer and the secondary photo-spacer are trapezoidal-shaped, and the primary photo-spacers and the secondary photo-spacers are arranged in pairs.

9. The curved liquid crystal panel according to claim 5, wherein the primary photo-spacers are disposed opposite the thin film transistors by contacting the thin film transistor without being fixed thereto.

10. The curved liquid crystal panel according to claim 5, wherein the primary photo-spacer and the secondary photo-spacer are spherical-shaped.

11. A method for manufacturing a curved liquid crystal panel, comprising:
preparing an array substrate which is provided with a plurality of thin film transistors;
preparing a color filter substrate which is provided with a plurality of primary photo-spacers and secondary photo-spacers, wherein stage differences between the secondary photo-spacers and the primary photo-spacers decrease from a center of the curved liquid crystal panel to boundaries thereof;
filling liquid crystal;
adhering the array substrate and the color filter substrate, wherein the primary photo-spacers correspond to a location of the thin film transistors; and
forming the curved liquid crystal panel by bending a liquid crystal box to a predetermined radian.

12. The manufacturing method according to claim 11, wherein lengths of the secondary photo-spacers decrease from the center of the curved liquid crystal panel to the boundaries thereof and are dependent upon a predetermined radian of the curved liquid crystal panel.

13. The manufacturing method according to claim 12, wherein the primary photo-spacers and the secondary photo-spacers are arranged in pairs, and lengths of the primary photo-spacers are the same.

14. The manufacturing method according to claim 11, wherein in the step of adhering the array substrate and the color filter substrate, the liquid crystal is filled within a cell gap located between the array substrate and the color filter substrate.

* * * * *